United States Patent
Sinha et al.

(10) Patent No.: US 10,004,161 B2
(45) Date of Patent: *Jun. 19, 2018

(54) ELECTRONIC MODULE WITH LATERALLY-CONDUCTING HEAT DISTRIBUTOR LAYER

(71) Applicant: INTERNATIONAL BUSINESS MACHINES CORPORATION, Armonk, NY (US)

(72) Inventors: Arvind K. Sinha, Rochester, MN (US); Kory W. Weckman, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/049,210

(22) Filed: Feb. 22, 2016

(65) Prior Publication Data

US 2016/0174416 A1 Jun. 16, 2016

Related U.S. Application Data

(60) Continuation of application No. 14/021,229, filed on Sep. 9, 2013, now Pat. No. 9,301,430, which is a
(Continued)

(51) Int. Cl.
*H05K 7/20* (2006.01)
*H01L 23/433* (2006.01)
(Continued)

(52) U.S. Cl.
CPC ........ *H05K 7/20509* (2013.01); *H01L 21/563* (2013.01); *H01L 23/36* (2013.01);
(Continued)

(58) Field of Classification Search
CPC ......... H05K 7/2039; H05K 7/20472–7/20481; H01L 23/3733; H01L 23/3735;
(Continued)

(56) References Cited

U.S. PATENT DOCUMENTS 5,016,138 A 5/1991 Woodman
5,109,317 A 4/1992 Miyamoto et al.
(Continued)

OTHER PUBLICATIONS

J.M. Mulligan, "Snap-On Heat Exchanger", IBM Technical Disclosure Bulletin, vol. 10, No. 8, (Jan. 1968) (Abstract Only).
(Continued)

*Primary Examiner* — Zachary M Pape
(74) *Attorney, Agent, or Firm* — Joseph Petrokaitis, Esq.; Kevin P. Radigan, Esq.; Heslin Rothenberg Farley & Mesiti P.C.

(57) ABSTRACT

An electronic module is provided in which a chip is disposed over a substrate and electrically connected to the substrate by a plurality of electrical connect structures disposed between the chip and the substrate. A heat distributor, fabricated of a thermally conductive material, is disposed between the chip and the substrate and sized to extend beyond an edge of the chip to facilitate conduction of heat laterally out from between the chip and substrate. The heat distributor includes openings sized and positioned to allow the electrical connect structures to pass through the heat distributor without electrically contacting the heat distributor. The heat distributor is electrically isolated from the electrical connect structures, the chip and the substrate. In one implementation, the heat distributor physically contacts a thermally conductive enclosure of the electronic module to facilitate conduction of heat from between the chip and substrate to the enclosure.

15 Claims, 8 Drawing Sheets

Related U.S. Application Data division of application No. 12/878,710, filed on Sep. 9, 2010, now Pat. No. 8,611,090.

(51) Int. Cl.
| | | |
|---|---|---|
| *H01L 21/56* | (2006.01) | |
| *H01L 23/36* | (2006.01) | |
| *H01L 25/065* | (2006.01) | |
| *H01L 23/00* | (2006.01) | |
| *H05K 13/00* | (2006.01) | |
| *H05K 3/32* | (2006.01) | |

(52) U.S. Cl.
CPC ............ *H01L 23/433* (2013.01); *H01L 24/32* (2013.01); *H01L 25/0657* (2013.01); *H05K 3/32* (2013.01); *H05K 7/205* (2013.01); *H05K 13/00* (2013.01); *H01L 2224/16225* (2013.01); *H01L 2224/16245* (2013.01); *H01L 2224/32225* (2013.01); *H01L 2224/73204* (2013.01); *H01L 2225/06513* (2013.01); *H01L 2225/06517* (2013.01); *H01L 2225/06589* (2013.01); *H01L 2924/01029* (2013.01); *H01L 2924/14* (2013.01); *Y10T 29/49117* (2015.01)

(58) Field of Classification Search
CPC ... H01L 23/4012; H01L 23/42; H01L 23/433; H01L 23/49568; H01L 25/117
USPC .................. 361/679.46–679.54, 688–723; 165/80.1–80.3
See application file for complete search history.

(56) References Cited

U.S. PATENT DOCUMENTS

| | | | |
|---|---|---|---|
| 5,247,423 A | 9/1993 | Lin et al. | |
| 5,313,099 A | 5/1994 | Tata et al. | |
| 5,371,652 A | 12/1994 | Clemens et al. | |
| 5,386,144 A | 1/1995 | Variot et al. | |
| 5,397,916 A | 3/1995 | Normington | |
| 5,420,751 A | 5/1995 | Burns | |
| 5,499,160 A | 3/1996 | Burns | |
| 5,543,664 A | 8/1996 | Burns | |
| 5,945,736 A | 8/1999 | Rife et al. | |
| 6,153,929 A | 11/2000 | Moden et al. | |
| 6,172,874 B1 | 1/2001 | Bartilson | |
| 6,191,480 B1 | 2/2001 | Kastberg et al. | |
| 6,205,654 B1 | 3/2001 | Burns | |
| 6,252,774 B1 | 6/2001 | Rife | |
| 6,297,960 B1 * | 10/2001 | Moden ................ | H01L 23/3675 257/724 |
| 6,380,616 B1 | 4/2002 | Tutsch et al. | |
| 6,396,700 B1 | 5/2002 | Chu et al. | |
| 6,414,390 B2 | 7/2002 | Nozawa | |
| 6,424,533 B1 | 7/2002 | Chu et al. | |
| 6,507,115 B1 | 1/2003 | Hofstee et al. | |
| 6,515,360 B2 | 2/2003 | Matsushima et al. | |
| 6,760,224 B2 | 7/2004 | Moden et al. | |
| 6,977,434 B2 | 12/2005 | Martino | |
| 7,016,192 B2 | 3/2006 | Beihoff et al. | |
| 7,057,270 B2 | 6/2006 | Moshayedi | |
| 7,518,873 B2 | 4/2009 | Park et al. | |
| 7,521,788 B2 | 4/2009 | Bang et al. | |
| 7,564,690 B2 | 7/2009 | Gilliland et al. | |
| 7,675,167 B2 | 3/2010 | Schlomann | |
| 7,745,952 B2 | 6/2010 | Nakatsu et al. | |
| 7,826,229 B2 | 11/2010 | Cromwell et al. | |
| 8,299,608 B2 * | 10/2012 | Bartley ................ | H01L 23/055 257/712 |
| 8,611,090 B2 | 12/2013 | Sinha et al. | |
| 8,779,585 B2 | 7/2014 | O'Connell et al. | |
| 9,301,430 B2 * | 3/2016 | Sinha .................... | H01L 21/563 |
| 2005/0286234 A1 | 12/2005 | Campbell et al. | |
| 2006/0267182 A1 | 11/2006 | Rumer et al. | |
| 2007/0066168 A1 | 3/2007 | Small et al. | |
| 2011/0085304 A1 * | 4/2011 | Bindrup ............... | H01L 21/4871 361/718 |
| 2012/0063095 A1 | 3/2012 | Sinha et al. | |
| 2013/0032935 A1 | 2/2013 | O'Connell et al. | |
| 2014/0016271 A1 | 1/2014 | Sinha et al. | |

OTHER PUBLICATIONS

Sinha et al., Restriction Requirement for U.S. Appl. No. 12/878,710, filed Sep. 9, 2010 (now U.S. Pat. No. 8,611,090 B2), dated Jan. 29, 2013.

Sinha et al., Office Action for U.S. Appl. No. 12/878,710, filed Sep. 9, 2010 (now U.S. Pat. No. 8,611,090 B2), dated Mar. 27, 2013.

Sinha et al., Notice of Allowance for U.S. Appl. No. 12/878,710, filed Sep. 9, 2010 (now U.S. Pat. No. 8,611,090 B2), dated Aug. 8, 2013.

O'Connell et al., Office Action for U.S. Appl. No. 13/198,895, filed Aug. 5, 2011 (now U.S. Pat. No. 8,779,585 B2), dated Nov. 29, 2013 (9 pages).

O'Connell et al., Notice of Allowance for U.S. Appl. No. 13/198,895, filed Aug. 5, 2011 (now U.S. Pat. No. 8,779,585 B2), dated Mar. 10, 2014 (7 pages).

Sinha et al., Office Action for U.S. Appl. No. 14/021,229, filed Sep. 9, 2013 (U.S. Patent Publication No. 2014/0016271 A1), dated Sep. 16, 2015 (8 pages).

Sinha et al., Notice of Allowance for U.S. Appl. No. 14/021,229, filed Sep. 9, 2013 (U.S. Patent Publication No. 2014/0016271 A1), dated Dec. 18, 2015 (5 pages).

\* cited by examiner

ELECTRONIC MODULE WITH LATERALLY-CONDUCTING HEAT DISTRIBUTOR LAYER

CROSS-REFERENCE TO RELATED APPLICATIONS

This application is a continuation of U.S. application Ser. No. 14/021,229, filed Sep. 9, 2013, which published Jan. 14, 2014, as U.S. Patent Publication No. 2014/0016271 A1, which is a divisional of U.S. application Ser. No. 12/878,710, filed Sep. 9, 2010, which issued Dec. 13, 2013, as U.S. Pat. No. 8,611,090 B2, each of which is hereby incorporated herein by reference in its entirety.

BACKGROUND

The present invention is directed to structures and methods for facilitating removal of heat from an electronic component. Electronic modules, such as single chip modules (SCMs) and multichip modules (MCMs), are efficient packages for housing semiconductor devices having a large number of connections. In a stacked multichip module, two or more chips are stacked on top of each other and enclosed within, for example, a single plastic or ceramic package. As a specific example, within a stacked MCM, one or more processor chips may be part of the stack of chips. Depending upon the implementation, MCM packaging permits a large number of chip-to-chip interconnections.

As an electronic component (e.g., chip) operates within an electronic module, heat is generated which must be removed or dissipated. Heat may be dissipated, for example, by a cooling structure such as an aluminum (Al) or copper (Cu) heat sink coupled to or comprising part of a thermally conductive cover of the electronic module. The heat sink absorbs heat from the electronic component, and dissipates the heat, for example, via direct air convection. Heat sinks are well known in the electronics industry, and are used extensively to dissipate heat generated by electronic components used in computers and various other electronic equipment.

Continued improvements in integrated circuit (IC) design and fabrication techniques allow IC manufacturers to produce ever-smaller and more powerful chips, resulting in a continuing need for more effective cooling mechanisms to be employed, including within an electronic module.

BRIEF SUMMARY

In one aspect, the shortcomings of the prior art are overcome and additional advantages are provided through the provision of an electronic module which includes: a first component, a second component, a plurality of electrical connect structures, and a heat distributor. The first component is disposed over the second component, and the plurality of electrical connect structures are disposed between and electrically connect the first component and the second component. The heat distributor, which is disposed between the first component and the second component, comprises a thermally conductive material and extends laterally beyond an edge of at least the first component to facilitate conduction of heat laterally out from between the first component and the second component past the edge of the first component. The heat distributor, which includes a plurality of openings sized and positioned to allow the plurality of electrical connect structures to pass therethrough without electrically contacting the heat distributor, is electrically isolated from the plurality of electrical connect structures.

In another aspect, an electronic module is provided which includes: a first component, a second component, a plurality of electrical connect structures, a thermally conductive enclosure, and a heat distributor. The first component is disposed over the second component, and the plurality of electrical connect structures are disposed between and electrically connect the first component and the second component. At least the first component is a chip. The thermally conductive enclosure is sized and configured to facilitate sealing at least the first component within the electronic module. The heat distributor, which is disposed between the first component and the second component, comprises a thermally conductive material and extends laterally beyond an edge of at least the first component to facilitate conduction of heat laterally out from between the first component and the second component past the edge of the first component. The heat distributor, which includes a plurality of openings sized and positioned to allow the plurality of electrical connect structure to pass therethrough without electrically contacting the heat distributor, is electrically isolated from the plurality of electrical connect structures.

In a further aspect, a method of fabricating an electronic module is provided. The method includes: providing a first component with a plurality of electrical connect structures; associating a heat distributor with the first component, the heat distributor comprising a thermally conductive material and extending laterally beyond an edge of the first component to facilitate conduction of heat laterally out away from the first component, the heat distributor including a plurality of openings sized and positioned to allow the plurality of electrical connect structures to pass therethrough without electrically contacting the heat distributor; positioning the first component and associated heat distributor over a second component, with the heat distributor disposed between the first component and the second component and the plurality of electrical connect structures electrically passing through the heat distributor and electrically connecting the first component to the second component, the heat distributor being electrically isolated from the plurality of electrical connect structures; and re-flowing the plurality of electrical connect structures to attach the plurality of electrical connect structures to the second component to form electrical connection between the first component and the second component, and injecting a thermal interface material as underfill between the first component and the heat distributor, and between the heat distributor and the second component, the thermal interface material electrically isolating the plurality of electrical connect structures from the heat distributor.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

"Electronic component" refers to any electronic component of, for example, a computer system or other electronic unit requiring cooling. By way of example, an electronic component may comprise one or more chips, including integrated circuit dies and/or other electronic devices to be cooled, such as one or more processor dies, memory dies and memory support dies. As a further example, an electronic component may comprise one or more bare dies or one or more packaged dies disposed on a common carrier. "Electronic module" refers to a structure comprising one or more electronic components and may include, for example, an enclosure for facilitating sealing the one or more electronic components within the electronic module. As used herein, single chip modules and multichip modules are examples of electronic modules.

Reference is made below to the drawings, which are not drawn to scale for ease of understanding, wherein the same reference number used throughout different figures designates the same or similar components.

Figure 1:
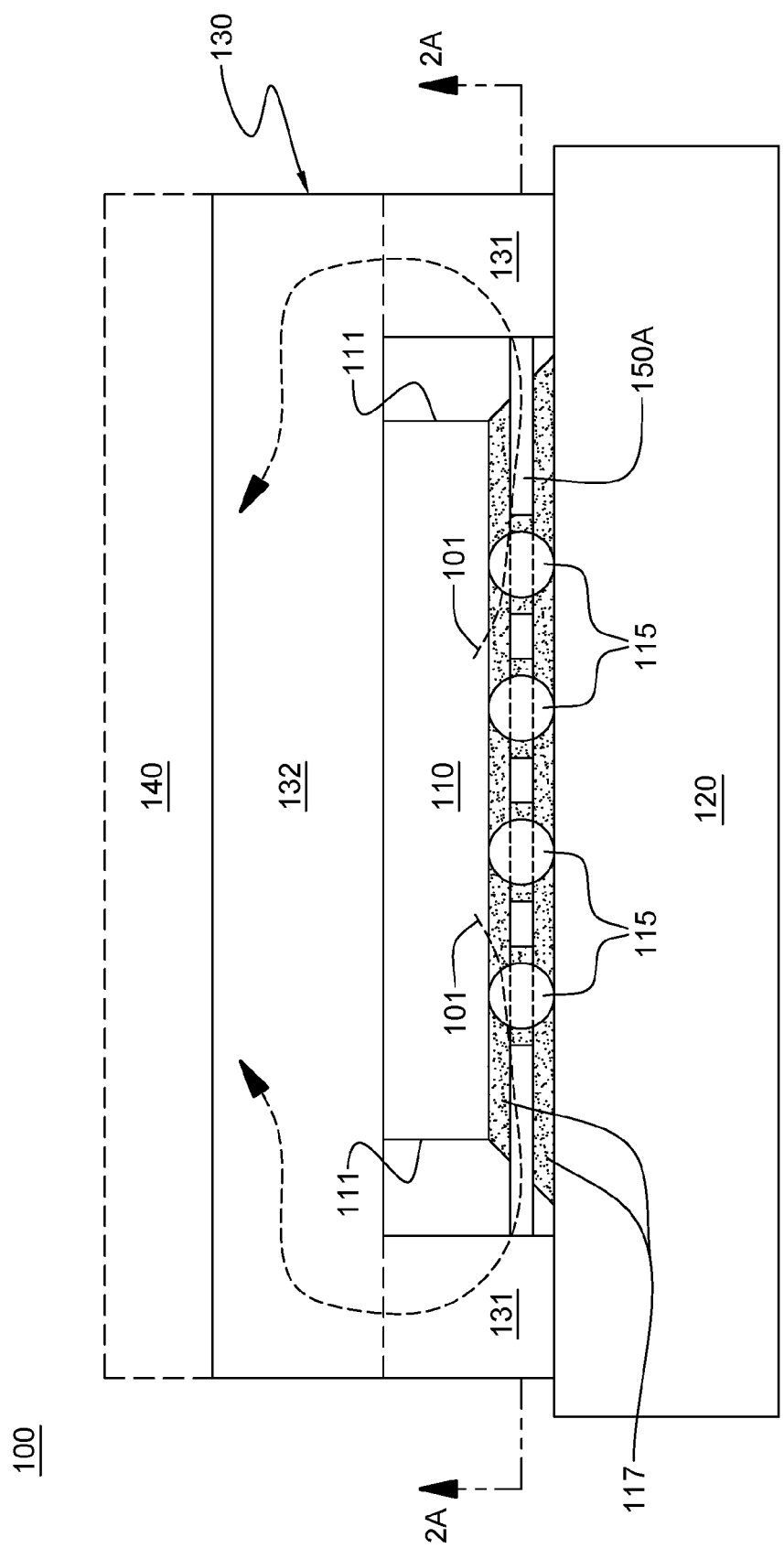
FIG. 1 is a cross-sectional elevational view of one embodiment of an electronic module, taken along line 1-1 of FIG. 2A, and illustrating one embodiment of a heat distributor incorporated therein, in accordance with an aspect of the present invention.

FIG. 1 is a cross-sectional elevational view of one embodiment of an electronic module 100, in accordance with an aspect of the present invention. In this embodiment, a chip 110, comprising, for example, a packaged or unpackaged circuit die, is disposed over a substrate 120, which may include conductive wiring (not shown) on an upper surface thereof and/or embedded therein. Chip 110 may comprise a flip chip implementation, wherein an active surface of the chip is in opposing relation to substrate 120, which permits chip 110 to be electrically connected to the wiring of substrate 120 via, for example, a plurality of electrical connect structures 115.

In one embodiment, the plurality of electrical connect structures 115 may comprise a plurality of controlled collapse chip connections (C4). As is known, C4 technology is suitable for interconnecting high I/O count and area array solder bumps on semiconductor chips to a base substrate, as well as for making chip-to-chip connections, for example, in a stack arrangement of semiconductor chips. Note that, as one example, chip 110 may comprise a processor chip. Note also that, although shown as a single chip, a plurality of chips 110 could be arrayed over substrate 120, for example, in an X-Y plane over a main surface of substrate 120.

An underfill material 117 surrounds the plurality of electrical connect structures 115 filling the space between chip 110 and substrate 120. Electronic module 100 further includes a thermally conductive enclosure 130 comprising thermally conductive sidewalls 131 and a thermally conductive cover 132, which may be separately fabricated and physically attached together, or integrally formed as a monolithic structure. As illustrated, thermally conductive enclosure 130 facilitates sealing chip 110 within the electronic module, for example, via thermally conductive sidewalls 131 engaging a surface of or a surface coupled to substrate 120. A heat sink 140 may optionally be coupled to thermally conductive cover 132 to facilitate dissipation of heat conducted from chip 110 through thermally conductive cover 132 into the heat sink. By way of example, heat sink 140 may comprise an air-cooled heat sink, or a fluid-cooled heat sink, such as a liquid-cooled cold plate.

Thermal performance of a single chip electronic module thus depends principally on the thermal interface material used to interface the semiconductor chip to the thermally conductive cover (or lid). The current solution for cooling electronic modules is to use a top-down cooling approach through the thermally conductive cover (and thermal interface material between the cover and the chip). The drawback to this approach is that it restricts the effective cooling area of the chip to the top surface of the chip. With a need for ever-higher power electronic modules, a more effective cooling mechanism is desired. This need is addressed herein (in one embodiment) by embedding a heat distributor mechanism within the underfill layer of the chip between the chip and the substrate. The heat distributor conducts heat laterally outward, away from the chip to the enclosure, and hence, outward and/or upwards (through the thermally conductive cover of the enclosure). This is also illustrated in FIG. 1.

Specifically, in accordance with an aspect of the present invention, a heat distributor 150A is sized and configured to be positioned between chip 110 and substrate 120 and to extend laterally beyond an edge of at least chip 110 to (in one embodiment) physically contact thermally conductive enclosure 130, and thereby facilitate direct conduction of heat 101 laterally out from the region between chip 110 and substrate 120 to the thermally conductive enclosure 130. In the embodiment depicted, heat distributor 150A is in physical contact with thermally conductive sidewalls 131 of thermally conductive enclosure 130. Other implementations are possible though. For example, a thermal interface material may be disposed between the edge (or ends) of the heat distributor(s) and the thermally conductive enclosure. Note that heat distributor 150A and the sidewalls of thermally conductive enclosure 130 advantageously provide alternate pathways for heat 101 conduction from chip 110 (and from substrate 120) to, for example, thermally conductive cover 132 of the enclosure.

In the embodiment illustrated, heat distributor 150A extends laterally beyond an edge 111 of chip 110, and chip 110 is spaced from thermally conductive sidewall 131 such that heat 101 (in addition to being conducted upwards from chip 110 into thermally conductive cover 132) may pass downward and laterally outward through heat distributor 150A to thermally conductive sidewalls 131, for transfer across thermally conductive cover 132 to, for example, heat sink 140.

Figure 2A:
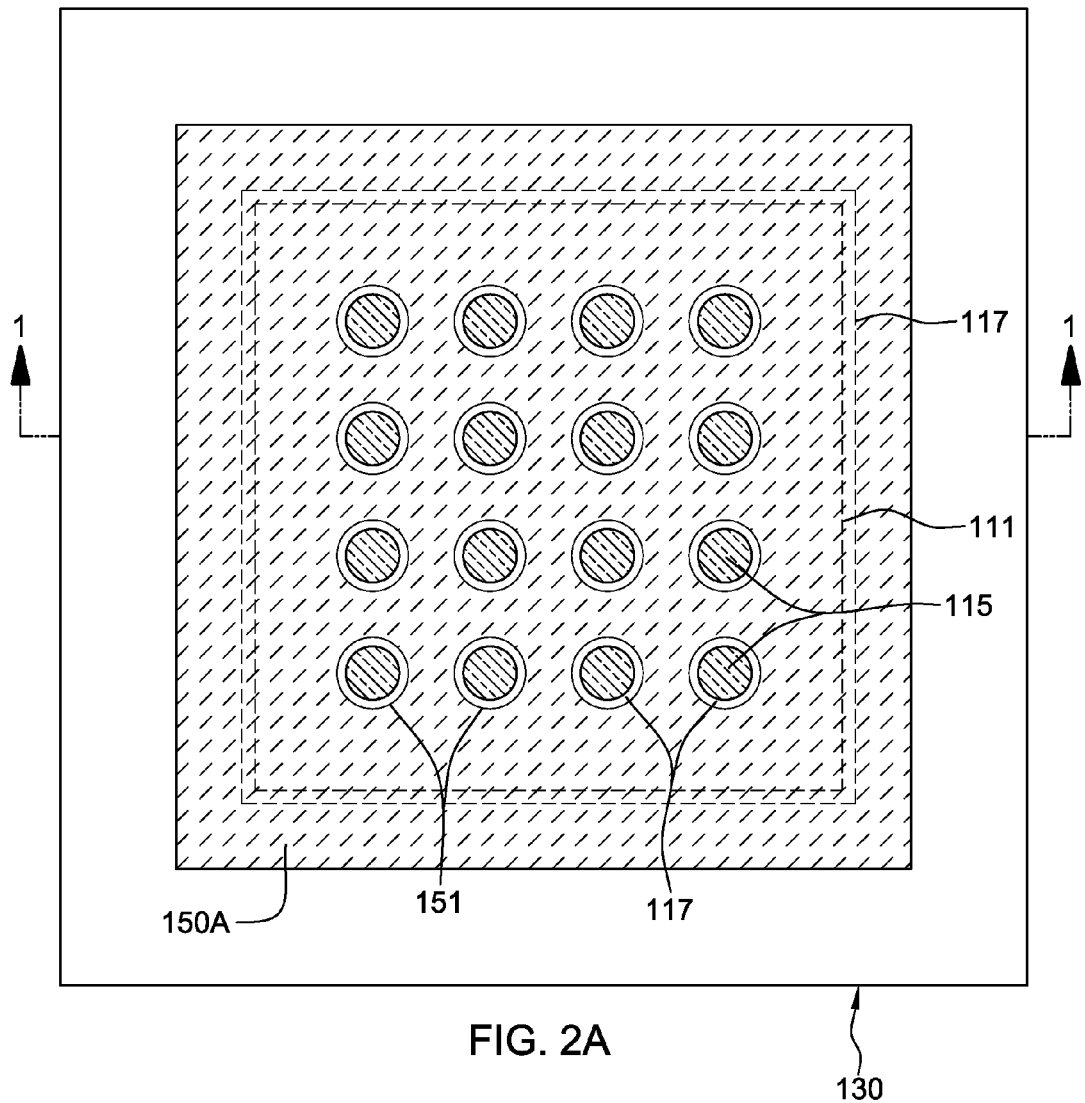
FIG. 2A is a cross-sectional plan view of the electronic module of FIG. 1, taken along line 2A-2A thereof, in accordance with an aspect of the present invention.

FIG. 2A is a cross-sectional plan view of the electronic module 100 of FIG. 1, taken along line 2A-2A thereof. In this embodiment, heat distributor 150A comprises a thermally conductive plate structure which extends in four directions laterally outward from edge 111 of chip 110. A plurality of openings 151 are provided, sized and configured for aligning to the plurality of electrical connect structures 115 to allow the electrical connect structures to pass through heat distributor 150A without electrically contacting the heat distributor. As illustrated, the plurality of electrical connect structures 115 are electrically separated from the heat distributor 150A via underfill material 117. In the embodiment of FIG. 2A, heat distributor 150A physically contacts in all four directions thermally conductive enclosure 130 to provide significantly enhanced heat conduction capabilities to the electronic module.

Note that, in the embodiments disclosed herein, the heat distributor is fabricated of a thermally conductive material to facilitate outward lateral spreading of heat from the region between components of the module to the thermally conductive enclosure. By way of example, the thermally conductive material may comprise a metal, such as copper, or a non-metal material, such as directional carbon nanotube fibers. The heat distributor may be fabricated of any thermally conductive material which facilitates the outward, lateral conduction of heat from the region between the components of the module to the thermally conductive enclosure. In one embodiment, the heat distributor is fabricated of a thermally conductive material which has a higher thermal conductivity than the underfill material. Specifically, the thermal conductivity of the heat distributor may be comparable to that of the thermally conductive cover of the enclosure. Further, those skilled in the art should note that the heat distributor may have a thickness which occupies, for example, 50% or more of the available space between the components of the module.

Figure 2B:
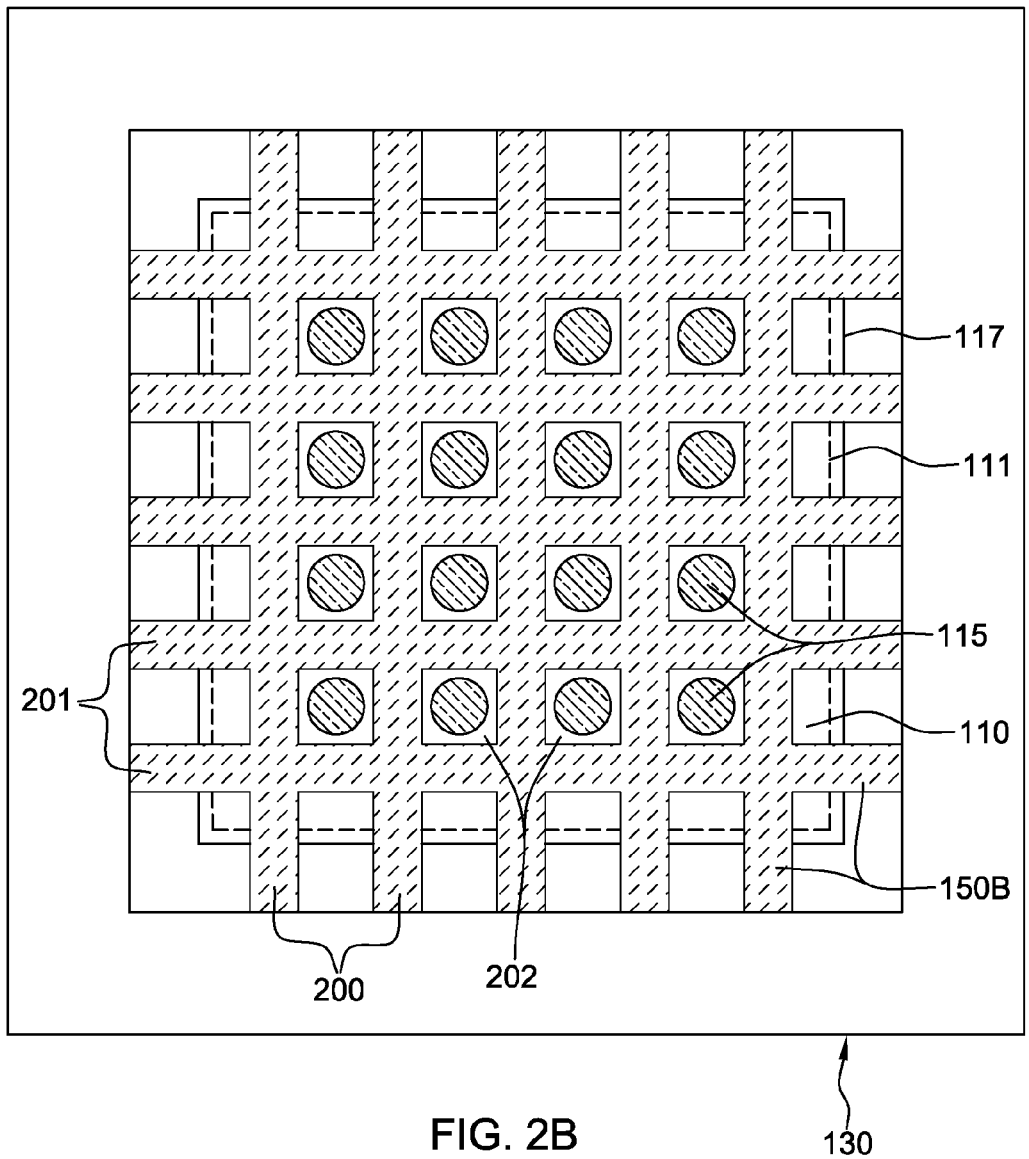
FIG. 2B is a cross-sectional plan view of an electronic module incorporating an alternate embodiment of a heat distributor, in accordance with an aspect of the present invention.
Figure 2C:
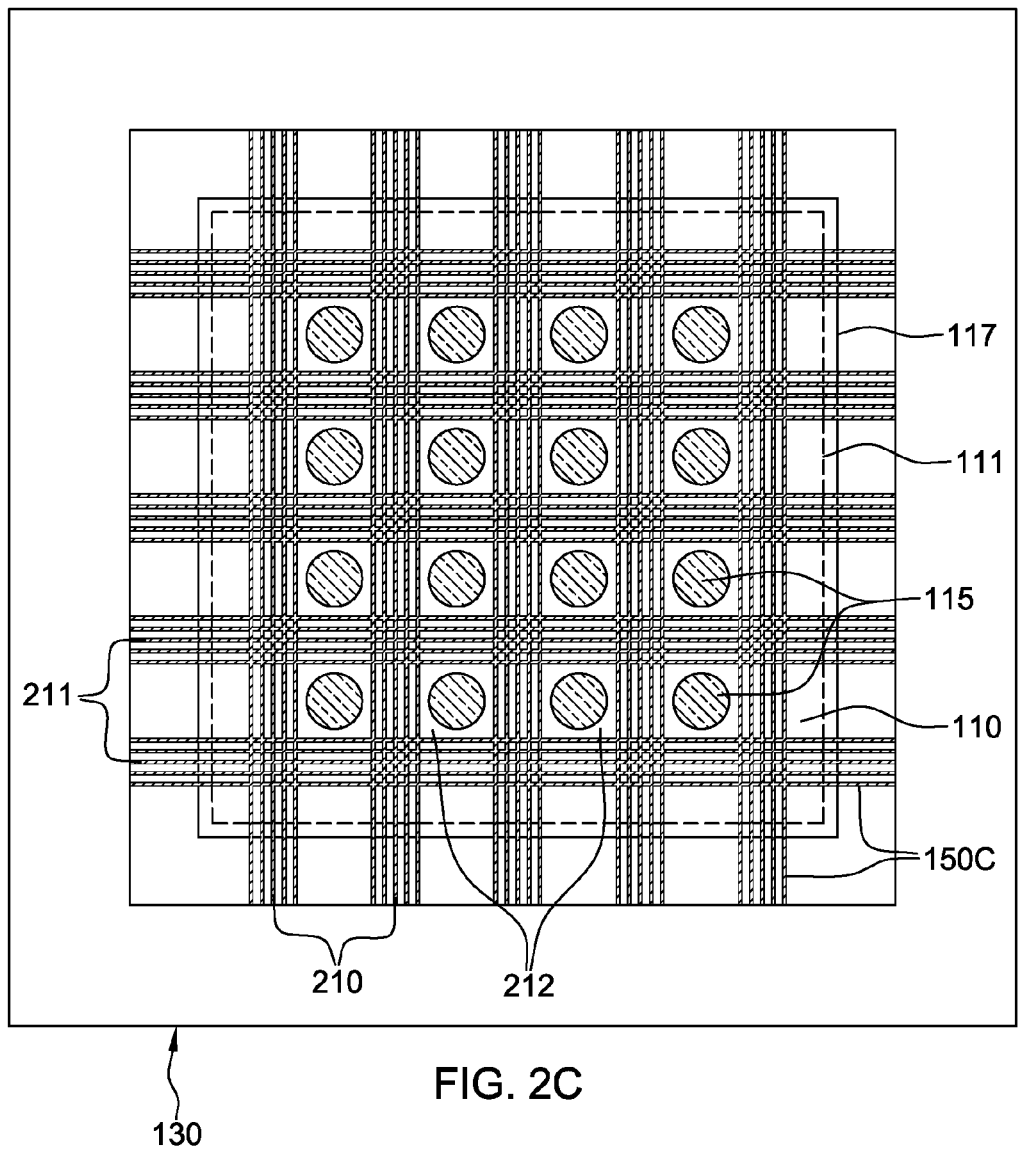
FIG. 2C is a cross-sectional plan view of an electronic module incorporating another alternate embodiment of a heat distributor, in accordance with an aspect of the present invention.
Figure 2D:
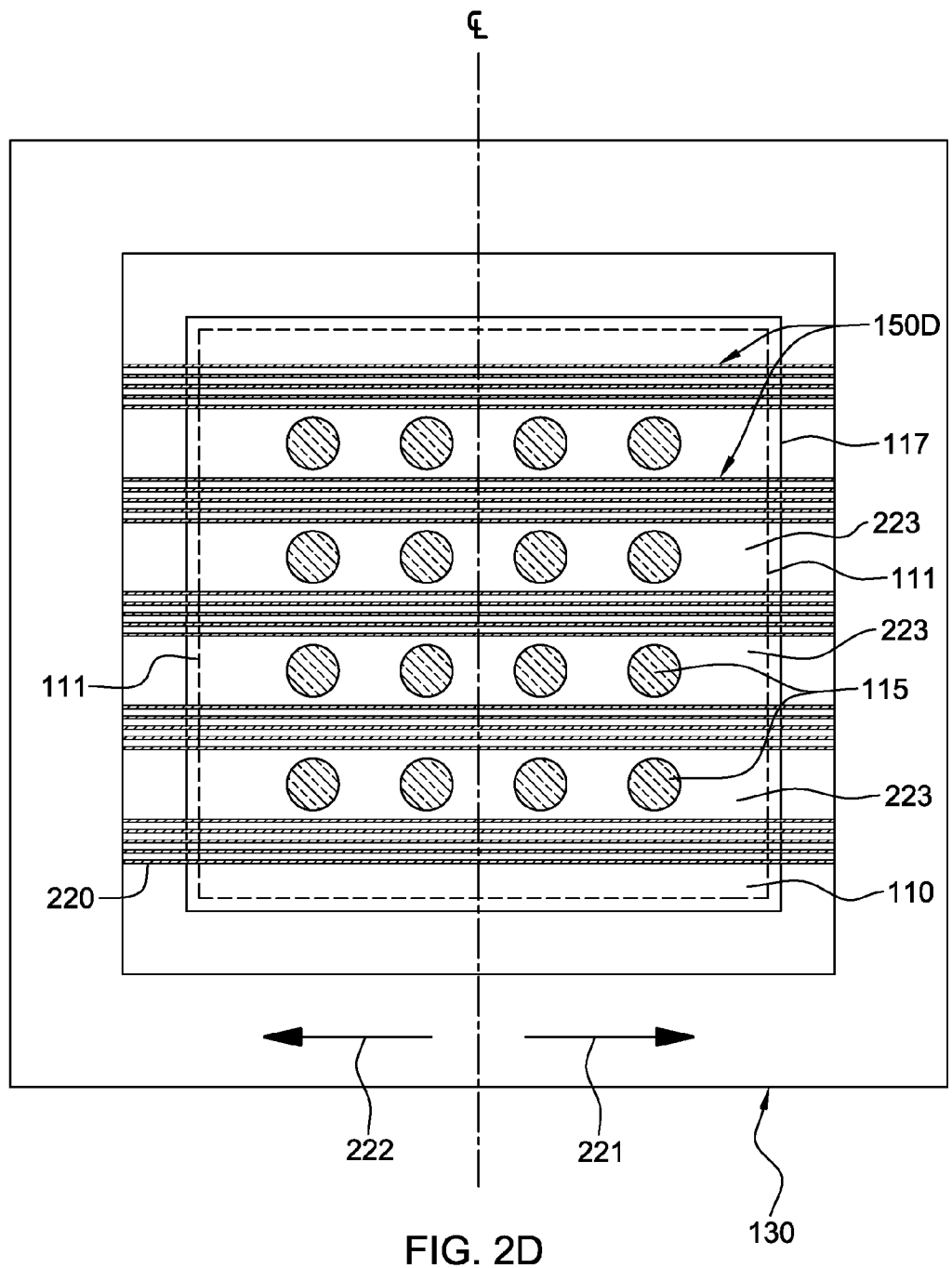
FIG. 2D is a cross-sectional plan view of an electronic module incorporating a further alternate embodiment of a heat distributor, in accordance with an aspect of the present invention.

FIGS. 2B-2D depict several alternate embodiments of a heat distributor, in accordance with an aspect of the present invention.

In FIG. 2B, a heat distributor 150B is shown to comprise a first plurality of parallel-extending thermal conductors 200 and a second plurality of parallel-extending thermal conductors 201. These sets of parallel-extending thermal conductors are shown (in this embodiment) to extend perpendicular to each other and spaced apart sufficiently to define openings 202 at the desired locations to allow the plurality of electrical connect structures 115 to pass therethrough without electrically contacting heat distributor 150B. As illustrated, the pluralities of parallel-extending thermal conductors 200, 201 extend beyond edge 111 of chip 110 (and underfill material 117) to physically contact an inner surface of the sidewalls of thermally conductive enclosure 130. Advantageously, these thermal conductors provide a plurality of heat conduction paths from the region between chip 110 and the substrate laterally outwards to the enclosure's thermally conductive sidewall (and hence, through the enclosure to, for example, a heat sink). Note that perpendicular intersection of the pluralities of parallel-extending thermal conductors 200, 201 is provided by way of example only. The thermal conductors could intersect at any angle desired for a given array of electrical connect structures. Also, note that fabrication of the pluralities of parallel-extending thermal conductors can be from, for example, a common thermally conductive sheet, or from individual thermal conductor strips secured in physical contact in the desired pattern.

In FIG. 2C, another heat distributor 150C is shown to comprise a first plurality of parallel-extending wires 210 and a second plurality of parallel-extending wires 211, which could replace the solid thermal conductors 200, 201 in the embodiment of FIG. 2B. In this embodiment, the parallel-extending wires 210, 211 may comprises flat-shaped, rectangular conductors, or circular diameter conductors, as desired. The first plurality of parallel-extending wires 210 and second plurality of parallel-extending wires 211 intersect, for example, crossing at substantially 90 degrees, and are arrayed to define openings 212 sized and positioned to allow the plurality of electrical connect structures 115 interconnecting chip 110 and the substrate to pass therethrough. Underfill material 117 facilitates electrical isolation of the plurality of electrical connect structures 115 from the first and second pluralities of parallel-extending wires 210, 211, which are shown to extend (in this embodiment) in all four directions outwards from the region below chip 110. As illustrated, the ends of the parallel-extending wires physically contact the inner surface of the thermally conductive enclosure 130, and thus provide multiple thermal conduction paths from the region between chip 110 and the substrate laterally outwards to the enclosure.

In the embodiment of FIG. 2D, a heat distributor 150D is shown comprising a plurality of parallel-extending wires 220. Wires 220 are illustrated extending in a first direction 221 and a second direction 222, which are opposite directions from, for example, a center line of chip 110. A plurality of openings 223 are provided, sized to accommodate the plurality of electrical connect structures 115 passing through heat distributor 150D. As illustrated, the plurality of parallel-extending wires 220 extend beyond edge 111 of chip 110 to physically contact an inner surface of the thermally conductive enclosure 130. Wires 220 may comprise flat-shaped, rectangular conductor, or circular diameter conductors, as desired.

Figure 3:
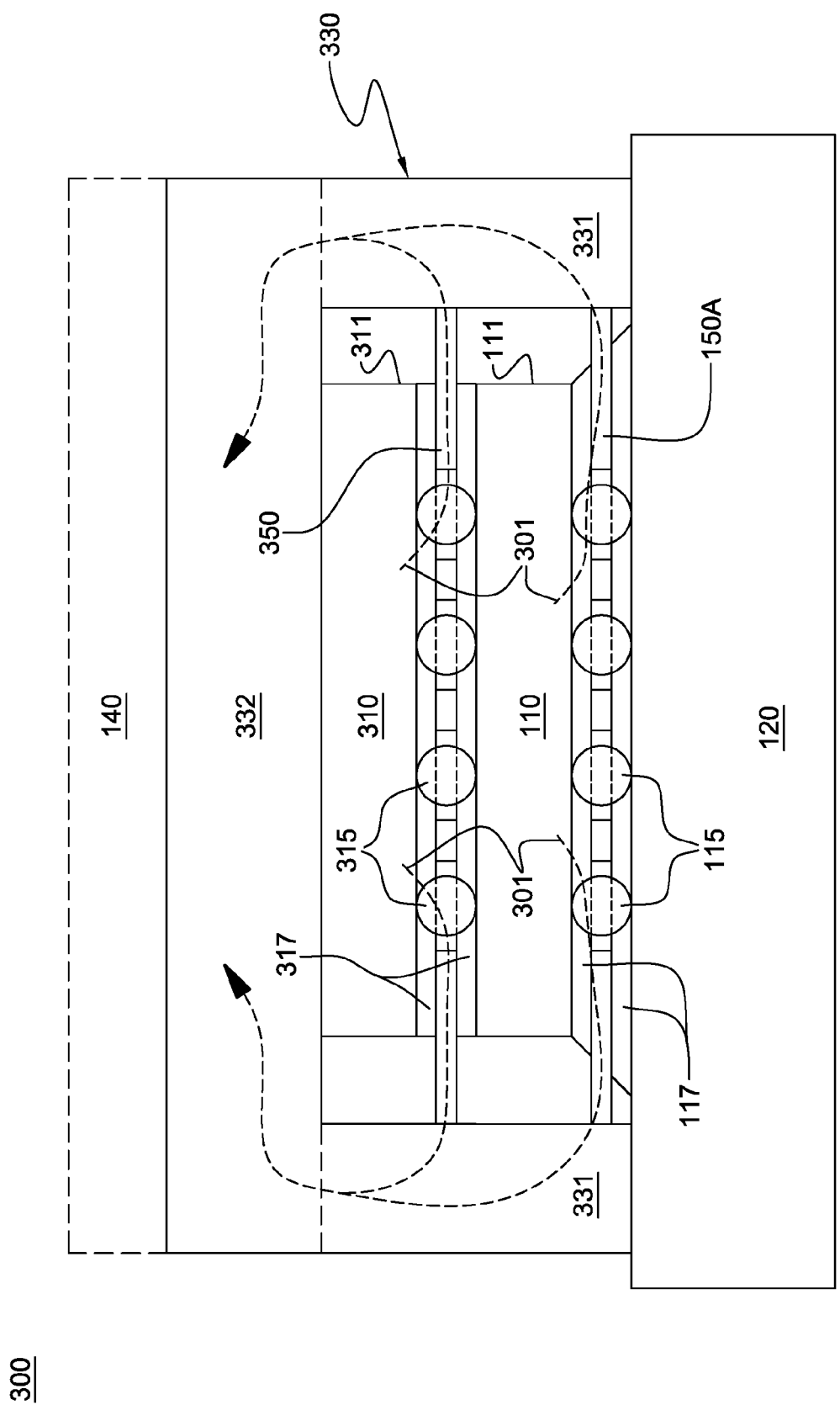
FIG. 3 is a cross-sectional elevational view of an alternate embodiment of an electronic module, in accordance with an aspect of the present invention.

FIG. 3 depicts an alternate embodiment of an electronic module, generally denoted 300, in accordance with an aspect of the present invention. Electronic module 300 is similar to electronic module 100, in that a chip 110 resides over a substrate 120 and is electrically connected thereto via a plurality of electrical connect structures 115. An underfill material 117 surrounds the plurality of electrical connect structures, and a heat distributor 150A is disposed within the underfill material to extend from a region between chip 110 and substrate 120 laterally outwards past at least an edge 111 of chip 110 to physically contact an inner surface of a sidewall 331 of a thermally conductive enclosure 330 of electronic module 300. Thermally conductive enclosure 330 is similar to thermally conductive enclosure 130 in the embodiments of FIGS. 1-2D, with the exception that the height of the sidewalls 331 may be adjusted to accommodate a stack of chips within the electronic module. Note that the two-chip stack illustrated in the electronic module 300 embodiment of FIG. 3 is provided by way of example only. The number of chips in the stack may be greater than two, depending upon the implementation.

In the illustrated embodiment, a second chip 310 is disposed over first chip 110 and is electrically connected to chip 110 via a second plurality of electrical connect structures 315. Underfill material 317, which may comprise the same material as underfill material 117, surrounds the plurality of electrical connect structures 315. In addition, a second heat distributor 350 extends from the region between second chip 310 and first chip 110 laterally outwards past the edges 311, 111 of the chips 310, 110 to physically contact an inner surface of the thermally conductive enclosure 330. Note that the heat distributors 150A, 350 may comprise the same heat distributor configuration, or different configurations, including any of the configurations depicted in FIGS. 2A-2D, or others. Selection of a particular configuration may depend, for example, upon the amount of heat to be conducted laterally outwards from between the respective components. Advantageously, heat distributors 150A, 350 provide alternate conduction pathways for heat 301 generated by the respective chips 110, 310 to reach the thermally conductive enclosure, thereby enhancing cooling of the chips.

Figure 4:
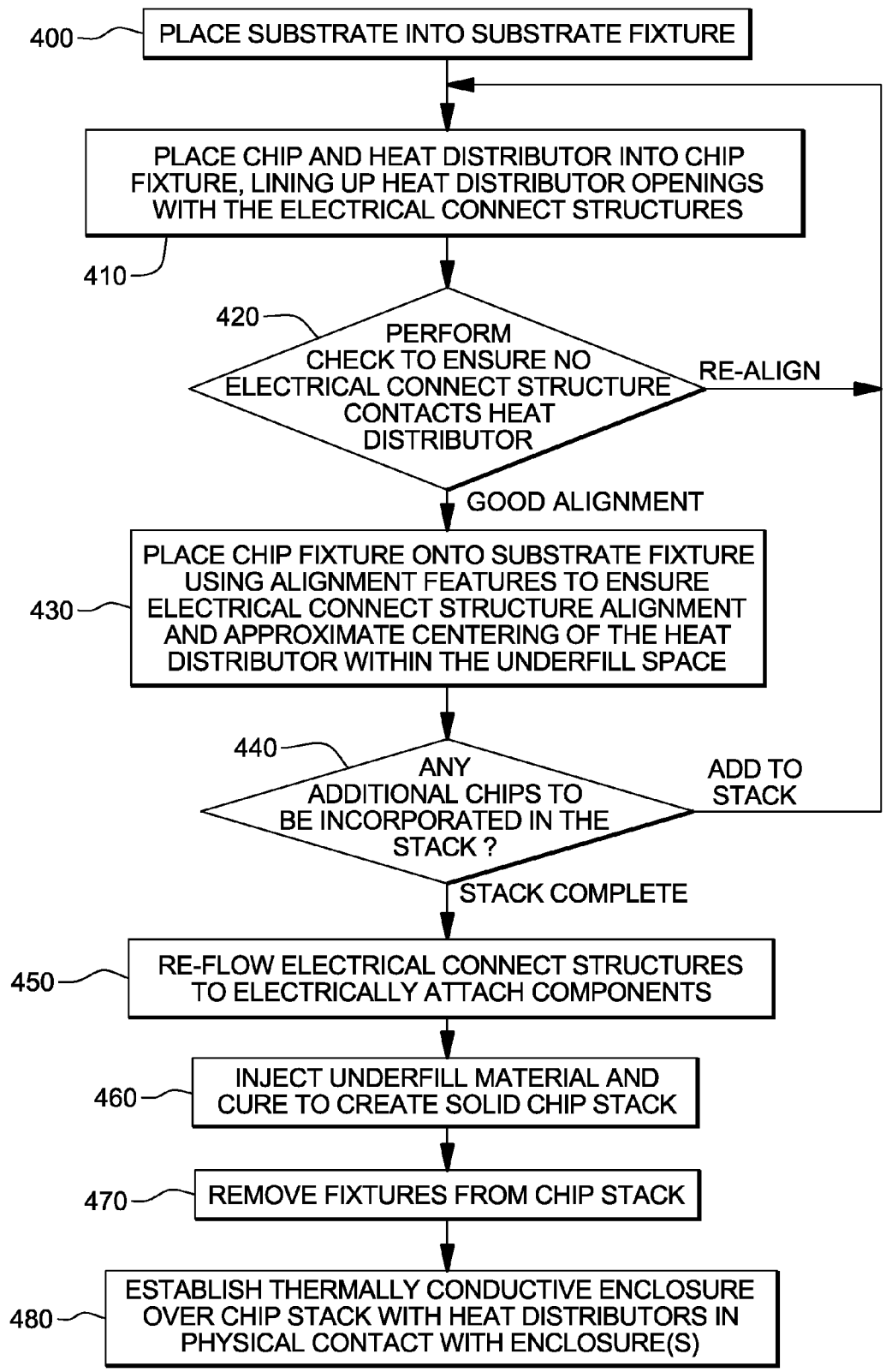
FIG. 4 is a flowchart of a process for fabricating an electronic module, such as depicted in FIGS. 1-3, in accordance with an aspect of the present invention.
Figure 5:
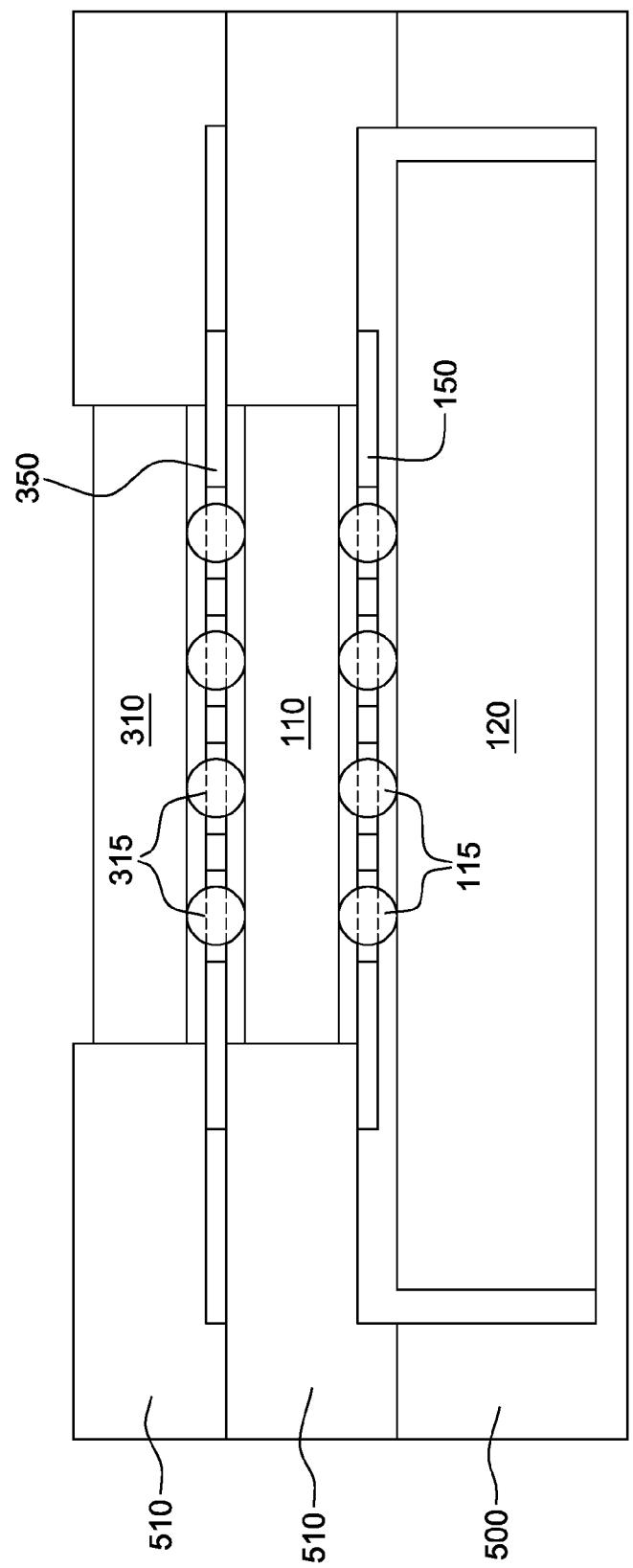
FIG. 5 is a cross-sectional elevational view of an intermediate structure attained during fabrication of an electronic module pursuant to the process of FIG. 4, in accordance with an aspect of the present invention.

FIGS. 4 & 5 depict one embodiment of a process for fabricating an electronic module, such as the modules depicted in FIGS. 1-3.

Referring to FIGS. 4 & 5 collectively, processing begins with placing a substrate 120 (FIG. 5) into a substrate fixture 500, such that substrate 120 is held in fixed position within the substrate fixture 400 (FIG. 4). A chip 110 (with electrical connect structures) and a heat distributor 150 associated therewith are separately placed into a chip fixture 510 (FIG. 5), lining up the heat distributor openings with the electrical connect structures 410 (FIG. 4). A check is performed to ensure that there is no physical contact between the plurality of connect structures and the heat distributor 420 (FIG. 4). If so, then the structure is re-aligned within the chip fixture 510 (FIG. 5) to ensure good alignment of the electrical connect structures within the corresponding openings of the heat distributor. Once good alignment is achieved, the chip fixture 510 (FIG. 5) is placed onto the substrate fixture 500 using alignment features of the fixtures to ensure that the electrical connect structures align to corresponding substrate metallization, and to ensure that the heat distributor is centered approximately within the space to be underfilled 430 (FIG. 4). A determination is then made whether there are additional chips to be incorporated into the stack 440 (FIG. 4), and if so, the next chip 310 (FIG. 5) and heat distributor 350 are placed 410 (FIG. 4) into an additional chip fixture 510 (FIG. 5). In the example of FIG. 5, a two-chip stack is illustrated over substrate 120. As shown, first chip 110 is held by a first chip fixture 510 and second chip 310 is a held by a second chip fixture 510, and a second plurality of electrical connect structures 315 are aligned via the fixtures to corresponding metallizations provided on the exposed surface of chip 110. During the repeating of the process for each chip in the stack, appropriate alignment of the plurality of electrical connect structures 315 within the openings of the heat distributor is verified. Once the stack has been completed to the desired configuration, then (in one example) the electrical connect structures are attached by re-flowing the solder to electrically attach the structures to the adjacent component 450 (FIG. 4). After re-flowing the electrical connect structures, underfill material is injected between adjacent components and cured to create a solid chip stack 460 (FIG. 4). Thereafter, the substrate and chip fixtures 500, 510 (FIG. 5) may be removed from the stack 470 (FIG. 4), and the thermally conductive enclosure can be established over the chip stack, with the heat distributors in physical contact with the sidewalls of the enclosure 480 (FIG. 4). A resultant two-chip electronic module is depicted in FIG. 3.

Advantageously, disclosed herein is a heat distributor which facilitates conduction of heat from a region between components of an electronic module laterally outward to a thermally conductive enclosure of the module. Various heat distributor configurations are illustrated, along with various electronic modules, by way of example only. Note that in alternate configurations, the heat distributor could be disposed closer to one component or another component, depending, for example, on the heat-generating capability of the opposing components within the electronic module. Should one component generate a greater amount of heat than another component, then it may be advantageous to dispose the heat distributor closer to that component, and in fact, the heat distributor could physically contact a surface of the component, if desired. Depending upon the implementation, the pitch of the electrical connect structures interconnecting the two opposing components in the module may be adjusted to accommodate the heat distributor disclosed herein. Both solid-body heat distributors and wire-mesh heat distributors are possible. Module modeling results indicate that significantly cooler chip temperatures may be obtained using heat distributors as disclosed herein. Advantageously, lower-level chips in a stack can be cooled as disclosed herein without requiring thermal conduction of the heat generated by those lower-level chips through upper-level chips to, for example, a heat sink disposed over a cover of the electronic module.

The terminology used herein is for the purpose of describing particular embodiments only, and is not intended to be limiting of the invention. As used herein, the singular forms "a", "an" and "the" are intended to include the plural forms as well, unless the context clearly indicates otherwise. It would be further understood that the terms "comprises" and/or "comprising", when used in the specification to specify the presence of stated features, integers, steps, operations, elements and/or components, but do not preclude the presence or additions of one or more other features, integers, steps, operations, elements, components and/or groups thereof.

The corresponding structures, materials, acts and equivalents of all means or steps plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those skilled in the art without departing from the scope and the spirit of the invention. The embodiment was chosen and described in order to best explain the principles of the invention and the practical application, and to enable others of ordinary skill in the art to understand the invention for various embodiments and various modifications as are suited to the particular use contemplated.

What is claimed is:

1. An electronic module comprising:
   a first component disposed over a second component;
   a plurality of electrical connect structures disposed between and electrically connecting the first component and the second component; and
   a heat distributor disposed between the first component and the second component, the heat distributor comprising a thermally conductive material and extending laterally beyond an edge of at least the first component to facilitate conduction of heat laterally out from between the first component and the second component past the edge of the first component, the heat distributor comprising a plurality of openings sized and positioned to allow the plurality of electrical connect structures to pass therethrough without electrically contacting the heat distributor, the heat distributor being electrically isolated from the plurality of electrical connect structures; and wherein the heat distributor comprises a plurality of wires extending laterally beyond the edge of the first component to facilitate conduction of heat laterally out from between the first component and the second component past the edge of the first component.

2. The electronic module of claim 1, further comprising a thermally conductive enclosure sized and configured to facilitate sealing at least the first component and the heat distributor within the electronic module, the heat distributor physically contacting the thermally conductive enclosure to facilitate conduction of heat from between the first component and the second component laterally outwards to the thermally conductive enclosure of the electronic module.

3. The electronic module of claim 2, wherein the thermally conductive enclosure comprises a thermally conductive cover disposed over the first component, and wherein the electronic module further comprises a heat sink coupled to the thermally conductive cover.

4. The electronic module of claim 1, wherein the heat distributor is fabricated and disposed to conduct heat laterally out from between the first component and the second component beyond the edge of at least the first component in at least a first direction and a second direction.

5. The electronic module of claim 4, wherein the first direction and the second direction are opposite directions.

6. The electronic module of claim 1, wherein the heat distributor extends beyond the edge of at least the first component in four directions to facilitate conduction of heat laterally outwards in the four directions, past the edge of the first component, from between the first component and the second component.

7. The electronic module of claim 1, wherein the plurality of wires comprises a first plurality of wires, and wherein the heat distributor further comprises a second plurality of wires, the second plurality of wires intersecting the first plurality of wires.

8. An electronic module comprising:
a first component disposed over a second component, at least the first component being a chip;
a plurality of electrical connect structures disposed between and electrically connecting the first component and the second component;
a thermally conductive enclosure enclosing at least the first component within the electronic module;
a heat distributor disposed between the first component and the second component, the heat distributor comprising a thermally conductive material and extending laterally beyond an edge of at least the first component to facilitate conduction of heat laterally out from between the first component and the second component past the edge of the first component, the heat distributor comprising a plurality of openings sized and positioned to allow the plurality of electrical connect structures to pass therethrough without electrically contacting the heat distributor, the heat distributor being electrically isolated from the plurality of electrical connect structures; and
wherein the heat distributor comprises a plurality of wires extending laterally beyond the edge of the first component to facilitate conduction of heat laterally out from between the first component and the second component past the edge of the first component.

9. The electronic module of claim 8, wherein the thermally conductive enclosure comprises a sidewall, and the heat distributor physically contacts the sidewall of the thermally conductive enclosure to facilitate conduction of heat from between the first component and the second component laterally outwards to the sidewall of the thermally conductive enclosure.

10. The electronic module of claim 8, wherein the first component comprises a first chip, the plurality of electrical connect structures comprise a first plurality of electrical connect structures, and the heat distributor comprises a first heat distributor, and wherein the electronic module further comprises a second chip disposed over the first chip, a second plurality of electrical connect structures disposed between and electrically connecting the first chip and the second chip, and a second heat distributor disposed between the first chip and the second chip, the second heat distributor comprising a thermally conductive material and extending laterally beyond an edge of the first chip and an edge of the second chip to facilitate conduction of heat laterally out from between the first chip and the second chip past the edge of the first chip and the edge of the second chip, the second heat distributor comprising a plurality of openings sized and positioned to allow the second plurality of electrical connect structures to pass therethrough without electrically contacting the second heat distributor, the second heat distributor being electrically isolated from the second plurality of electrical connect structures.

11. The electronic module of claim 10, wherein the thermally conductive enclosure comprises a sidewall, and the first heat distributor and the second heat distributor each physically contact the sidewall of the thermally conductive enclosure to facilitate conduction of heat from between the first chip and the second chip, and from between the first chip and the second component laterally outwards to the sidewall of the thermally conductive enclosure.

12. The electronic module of claim 8, wherein the heat distributor comprises a wire mesh structure disposed between the first component and the second component and extending laterally beyond the edge of the first component to facilitate conduction of heat laterally outwards from between the first component and the second component past the edge of the first component to the thermally conductive enclosure.

13. The electronic module of claim 8, wherein the plurality of wires comprises a first plurality of wires, and wherein the heat distributor further comprises a second plurality of wires, the second plurality of wires intersecting the first plurality of wires.

14. A method of fabricating an electronic module, the method comprising:
providing a first component with a plurality of electrical connect structures;
associating a heat distributor with the first component, the heat distributor comprising a thermally conductive material and extending laterally beyond an edge of the first component to facilitate conduction of heat laterally out away from the first component, the heat distributor comprising a plurality of openings sized and positioned to allow the plurality of electrical connect structures to pass therethrough without physically contacting the heat distributor; and
providing the first component and associated heat distributor over a second component, with the heat distributor disposed between the first component and the second component and the plurality of electrical connect structures passing through the heat distributor and electrically connecting the first component to the second component; and injecting a thermal interface material as underfill between the first component and the heat distributor and between the heat distributor and the second component, and within the plurality of openings of the heat distributor, the thermal interface material facilitating electrically isolating of the plurality of electrical connect structures from the heat distributor where passing through the heat distributor.

15. The method of claim 14, further comprising using a thermally conductive enclosure to enclose at least the first component and the heat distributor within the electronic module, the using comprising physically contacting the heat distributor to a sidewall of the thermally conductive enclosure to facilitate conduction of heat from between the first component and the second component laterally outwards to the sidewall of the thermally conductive enclosure.

\* \* \* \* \*